United States Patent [19]
Redpath et al.

[11] Patent Number: 6,150,814
[45] Date of Patent: Nov. 21, 2000

[54] METHODS OF ACHIEVING PHASE CONTRAST IN MAGNETIC RESONANCE IMAGING AND A RELATED APPARATUS

[75] Inventors: Thomas William Tennant Redpath, Aberdeen; Fergus Iain McKiddie, Laurencekirk; Rosemary Carmen Dymond, Cardiff, all of United Kingdom

[73] Assignee: BTG International Limited, London, United Kingdom

[21] Appl. No.: 09/034,309

[22] Filed: Mar. 3, 1998

Related U.S. Application Data

[63] Continuation of application No. PCT/GB96/02172, Sep. 4, 1996.

[30] Foreign Application Priority Data

Sep. 4, 1995 [GB] United Kingdom .................... 9518009
Jan. 8, 1996 [GB] United Kingdom .................... 9600296

[51] Int. Cl.[7] ....................................................... G01U 3/00
[52] U.S. Cl. ........................................... 324/307; 324/309
[58] Field of Search ..................................... 324/300–322

[56] References Cited

U.S. PATENT DOCUMENTS

| 3,999,118 | 12/1976 | Hoult | .................................. 324/0.5 A |
| 4,609,872 | 9/1986 | O'Donnell | .............................. 324/306 |

FOREIGN PATENT DOCUMENTS

| 0 210 038 | 1/1987 | European Pat. Off. . |
| 0 280 310 | 8/1988 | European Pat. Off. . |
| 0 371 477 | 6/1990 | European Pat. Off. . |
| 0 564 973 A2 | 10/1993 | European Pat. Off. . |

OTHER PUBLICATIONS

Dymond et al, "Application of the principle of optical phase–contrast microscopy to velocity phase–encodedMRI of blood flow in the aorta," The British Journal of Radiology, May 1996, pp. 410–414.

Shung K., Smith M., and Tsui B. "Principles of Medical Imaging" textbook Academic Press Inc. San Diego California pp. 231, 236, 241, 242 no month, 1992.

Spritzer, et al., "Rapid MR Imaginh of Blood Flow with a Phase–Sensitive, Limited–Flip–Angle, Gradient Recalled Pulse Sequence: Preliminary Experience", Radiology, vol. 1, No. 1, Jul. 1990, pp. 255–262.

Zernike, "Phase Contrast, a New Method for the Microscopic Observation to Transparent Objects", Physica IX, Jul. 1942, pp. 686–693.

Young, et al., "Chinical Magnetic Susceptibility Mapping of the Brain", Journal of Computer Assisted Tomography, 1987, pp. 2–6.

Ahn, et al, "A New Phase Correction Method in NMR Imaging Based on Autocorrelation and Histogram Analysis", IEEE Transactions on Medical Imaging, Mar. 1987, pp. 32–36.

Bernstein, et al., "Improved detectability in low signal–to–noise ration magnetic resonance images by means of a phase–corrected real reconstruction", Medical Physics, vol. 16, No. 5, Sep./Oct. 1989, pp. 813–817.

Moran, "A Flow Velocity Zeugmatographic Interlace for NMR Imaging in Humans", Magnetic Resonance Imaging, vol. 1, No. 4, 1982, pp. 197–203.

(List continued on next page.)

*Primary Examiner*—Christine K. Oda
*Assistant Examiner*—Tiffany A. Fetzner
*Attorney, Agent, or Firm*—Pillsbury Madison & Sutro LLP

[57] ABSTRACT

The invention relates to a method of obtaining phase information in magnetic resonance imaging (MRI) and employing this information to produce an enhanced image. In the past, magnetic resonance imagers have obtained data which contains phase as well as magnitude information. Often the phase information has been discarded in order to avoid image artifacts, which are usually attributable to motion. The present invention employs a technique in which this phase information is used in order to improve image quality, in an analogous method to that used in optical microscopy.

17 Claims, 12 Drawing Sheets

OTHER PUBLICATIONS

Edelstein, et al., "A signal–to–noise calibration procedure for NMR imaging systems", Medical Physics, vol. 1, No. 2, Mar./Apr. 1984, pp. 180–185.

Grover, et al., "NMR Spin–Echo Flow Measurements", Journal of Applied Physics, vol. 42, No. 1, Mar. 1, 1971, pp. 938–940.

Redpath, et al., "A new method of NMR flow imaging", Phys. Med. Biol., vol. 29, No. 7, Feb. 22, 1984, pp. 891–895.

Bernstein, et al., "Comparison of Phase–Difference and Complex–Difference Processing in Phase–Contrast MR Angiography", JMRI, vol. 1, No. 6, Dec. 1991, pp. 725–729.

Nayler, et al., "Blood Flow Imaging by Cine Magnetic Resonance", Computer Assisted Tomography, vol. 10, No. 5, Sep.–Oct. 1986, pp. 715–722.

METHODS OF ACHIEVING PHASE CONTRAST IN MAGNETIC RESONANCE IMAGING AND A RELATED APPARATUS

This is a continuation of International Appln. No. PCT/GB96/021272 filed Sep. 4, 1996 which is designated the U.S.

BACKGROUND OF THE INVENTION

1. Field of the Invention

The present invention relates to methods of obtaining phase information in Magnetic Resonance Imaging (MRI) and a related Apparatus.

2. Discussion of Related Art

Magnetic Resonance Imaging (MRI) is a technique for imaging a material by exciting nuclei in the material when the material is in a strong magnetic field. The strong magnetic field is known as a static magnetic field. Nuclei are then excited by a radio frequency magnetic field. Positional information is obtained by the generation of magnetic field gradients. A voltage induced in a receiver coil after the gradient field is removed is measured. It is the information derived from the induced voltage which is used, with sophisticated computing systems, to produce an image which is readily recognised by the eye.

Other information exists in the induced voltage signal. Information about the phase of an induced voltage signal is useful in distinguishing two materials (a and b) whose induced voltage $S_a$ and $S_b$ are of similar magnitude.

Magnetic Resonance Imaging (MRI) is therefore a powerful medical imaging technique which generates data which contains phase as well as magnitude information, and essentially depicts the magnitude and phase of the transverse nuclear magnetisation within 20 an elemental unit volume called a voxel. However, when the image is displayed, the phase of the data is often removed, to avoid image artifacts, which are often attributable to related motion between two or more material types being imaged. In this aspect, MRI has parallels with optics, because light is also an electromagnetic wave having both an amplitude and a phase. In optics, as in MRI, the phase is often discarded in imaging methods. For instance a photographic emulsion is sensitive only to the intensity of the light.

An example of an MRI technique which uses both voltage phase and magnitude information is described in a letter in Phys. Med. Biol. 1984 Vol. 29 No. 7 at pages 891–898.

SUMMARY OF THE INVENTION

The present invention has been made following recognition of an existing problem and as a result of an attempt to solve that problem. A problem associated with optical systems was identified by Zernike in a paper, published in July 1942 in Physica IX, No. 7 at pages 686 to 698 in which the technique of imaging a microscopic object using phase contrast was described.

Zernike stated that in order to calculate the direct wave which is transmitted in the direction of the incident wave, the average of the vibrations emerging from the grating has to be used. The same result is obtained by taking the average over one period of the grating as expressed by the following:

$$c_o = \frac{1}{2\pi} \int_{-\pi}^{\pi} f(x) dx \quad (1)$$

In order to calculate the phases and amplitudes of spectra of different order, it was observed that diffracted wave fronts are propagated only in such directions that the phases of the waves, from contiguous periods of the grating, show phase differences of m. $2\pi$ on the wave front. Therefore the diffracted lightwave which gives rise to the $m^{th}$ order spectrum is represented by:

$$c_m = \frac{1}{2\pi} \int_{-\pi}^{\pi} f(x) e^{imx} dx \quad (2)$$

Here m may have all positive and negative integral values, corresponding to the different diffracted waves on the right (positive m) and on the left (negative m) of the direct wave. As is indicated diagrammatically in FIG. 1, the phases of the different waves are compared for wave fronts passing through the origin 0.

In the conjugate plane P' a coordinate x' is defined and expressed in such units that conjugate points in P and P' have equal coordinates. The interference effect of the diffracted waves in the plane P', e.g. in 0' may be found. Now the optical paths from 0 to 0' through the objective are all equal. Therefore the relative phases of the different beams are the same in 0' as they were in 0, so that the resulting vibration in 0' is simply found by summing the complex numbers $c_m$. To find the result for an arbitrary point of the image for which x'=a, the origin 0 is shifted to x=a and the new values $c'_m$ are:

$$c'_m = \frac{1}{2\pi} \int_{-\pi}^{\pi} f(x) e^{im(x-a)} dx = e^{-ima} C_m. \quad (3)$$

The vibration in x'=a is then found by summing the $c_m$, which is:

$$V = \sum_{-\infty}^{\infty} c_m e^{imx'} \quad (4)$$

This expression together with the expression at 2 above, is the complex form of the Fourier series for f(x). This proves the statement that the image is exactly similar to the object in structure and phase, at least in the ideal case when the sum in expression 3, is extended from $-\infty$ to $+\infty$.

The general result is that by the phase-contrast method transparent details of an object which differ in thickness or in refractive index appear as differences of intensity in the image. An important increase of sensitivity can further be obtained by the use of an absorbing phase strip. The effect of diffraction by the phase strip is then considered and practical methods to make the resulting diffraction-halo as faint as possible are discussed. Various reasons are found why the strip should preferably be of circular form, with a corresponding annular diaphragm in a condenser. Finally the methods of preparing phase strips and of placing and adjusting them in the microscope are discussed.

Thus the problem and solution have been known in optics for many years but there has been no incentive to employ techniques of phase contrast in MRI systems.

According to the present invention there is provided a method of obtaining phase information in Magnetic Resonance Imaging (MRI) in which both magnitude and phase information are used to manipulate content in a displayed image.

According to a further aspect of the present invention there is provided an apparatus for obtaining phase information in Magnetic Resonance Imaging and for displaying an image so obtained, comprising: means for applying magnetic fields to an object to be imaged; means for obtaining an output signal in such a way that the output signal contains phase information; means for applying a phase shift to said phase information in the output signal; processing means for obtaining an image from information relating to the magnetic field signal, the output signal and the phase shifted output signal, such that both magnitude and phase information are used to manipulate the content of data representative of an image; and means for displaying said image.

Preferably the apparatus employs the difference between the phase of the output signal and the phase of the phase shifted signal to correct any phase errors in the output signal.

It will be appreciated that the aforementioned method, when used as part of a phase-contrast method, enables certain features of an object to be imaged. Previously it may not have been possible to isolate some features in an object from other similar features. For example in the analogy of optics.

Preferably phase contrast in MRI is achieved by employing a phase advance or a phase retard device or method. One way of achieving this is to shift the frequency of the phase of the k=0 point of data acquisition by 90° before forming an image by a 2 or 3-Dimensional Fourier Transforming (2D-FT or 3D-FT) the data.

An alternative way in which such phase shifting could be achieved is to add a complex constant to complex image data before calculating its magnitude.

The improvements in quality of the image are marked.

BRIEF DESCRIPTION OF THE DRAWINGS

Embodiments of the present invention will now be described, by way of example only and with reference to the Figures in which.

DETAILED DESCRIPTION OF THE PREFERRED EMBODIMENTS

It will be appreciated that variation to the above embodiments, may be made without departing from the scope of the invention. For example, one set of data can be acquired from a phantom thus the machine based artifact can be calculated and this is then used to correct the patient data. Similarly Schlieren methods may be applied to the data, such that other types of imaging techniques may be used with the invention.

Figure 1:
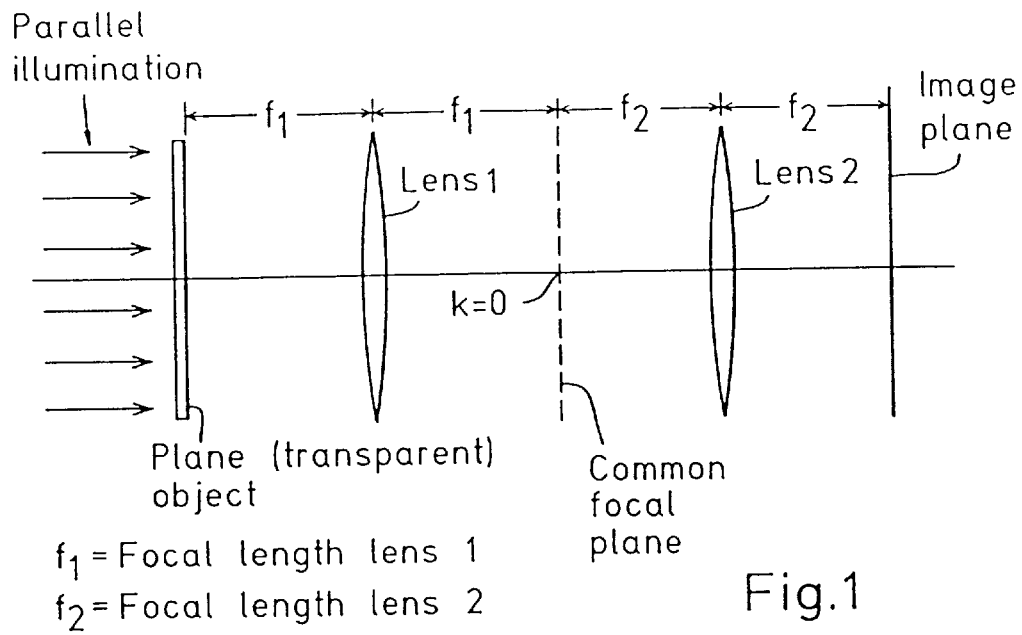
FIG. 1 is a ray diagram showing an optical analogy with lenses and an object.
Figure 2:
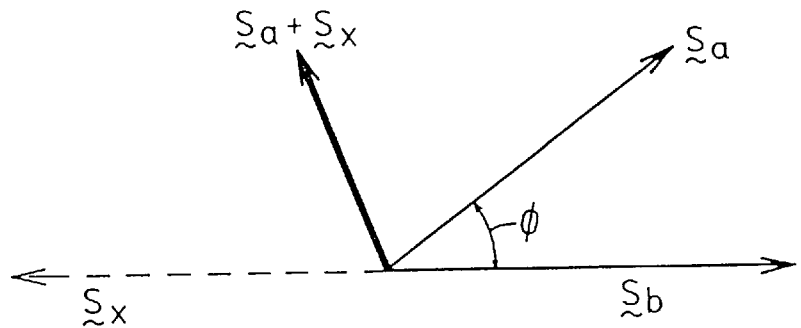
FIG. 2 is a vector diagram.
Figure 3:
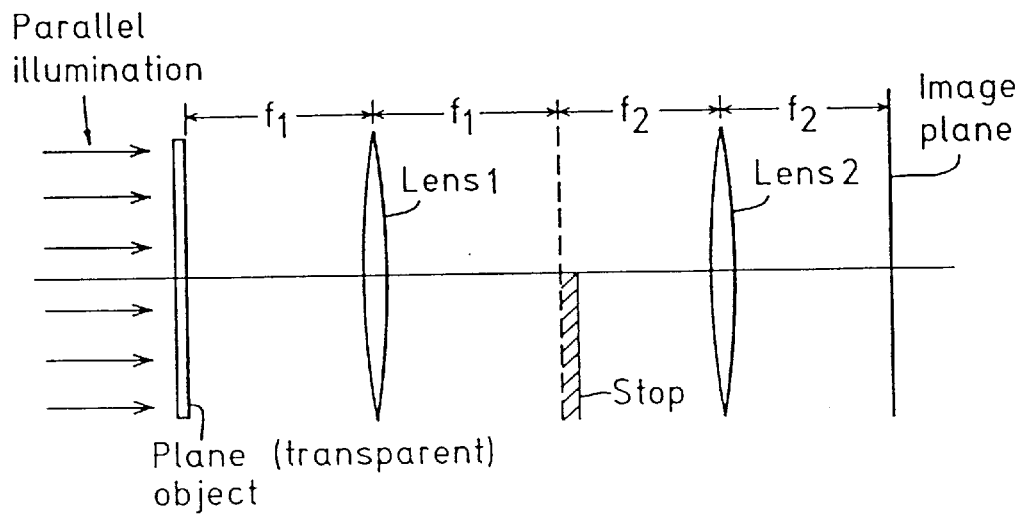
FIG. 3 is a ray diagram showing spatial relationship of an image plane and k-space to illustrate the Schlieren method in optics.

With reference to FIGS. 1 and 2, when a lens forms an images, of a plane object the focal plane of the lens effectively contains k-space data, because in that plane, the magnitude and phase of the light is a 2D-FT of the image. Zernike proposed phase-shifting the k=0 point by making a phase plate to retard the centre of the focal plane by 90°. This was done using a small spot of varnish. For example if the complex image data for a pixel is considered as a vector and two tissue types, a and b have nuclear magnetic resonance signals of similar magnitude but different phases, it is possible to add a vector offset $S_x$ to null $S_b$. In the magnitude image tissue b is nulled, while the signal from a is $|S_a+S_x|$. Thus phase information has been imported into a magnitude image without the necessity of displaying a calculated phase image on and without the attendant artifacts which that entails.

Schlieren techniques may also be introduced into MRI. In this case a practical advantage is that only approximately one half of available k-space needs to be acquired.

The optical analogy has been described in the above referenced letter by Zernike. Alternatively, if all k-space is acquired, the phase of one half of k-space can be reversed.

The method in MRI is to acquire approximately half of k-space and zero fill the remainder before performing any transformations. Alternatively the portion of k-space may be phase-reversed before performing any transformations.

Applications of the present technique are in phase-velocity imaging; although any effect which produces phase-contrast could be utilised (e.g. fat-water chemical shift in a gradient-echo image).

The invention is described with specific reference to a preferred method of imaging flowing fluids by nuclear magnetic resonance (NMR). The method employs the phase of a voltage signal in order to obtain a measure of the magnitude and direction of flow in the fluid. Live images in FIGS. 6, 7 and 8 are presented which demonstrate the implementation of this technique in conjunction with a spin-warp imaging method as described by Edelstein et. al. in 1980. Although it will be appreciated that the invention may be employed in other imaging sequences which traverse k-space in a spiral trajectory or spoke trajectory and it is therefore not limited to rectilinear raster k-space trajectory types of imaging sequence.

The phase of a signal from a stationary spin packet, excited in the presence of a static field $B_O$, is given by $$\phi_r = \gamma B_o t \tag{5}$$

where $\phi$ is the phase and $\gamma$ is the gyromagnetic ratio. If a field gradient is applied then:

$$\phi = \gamma \left( B_o + x_i \frac{\partial B_o}{\partial x_i} \right) t \tag{6}$$

where $X_i$ is the coordinate of the spin in the gradient direction. The phase difference of a spin at $X_i$ relative to a stationary spin at the origin is given by:

$$\phi_r = \int \gamma x_i \frac{\partial B_o}{\partial x_i} dt = \int \gamma x_i G_{xi} dt. \tag{7}$$

For example, in the present method if it is desired to measure flow in a particular direction, a relatively strong gradient pulse of duration $\tau_o$ is applied in the desired direction, followed by an interval $\tau_i$, then after a further interval, by a second pulse identical to the first pulse but of an opposite polarity. Alternatively two identical pulses separated by a 180° pulse may be applied. A stationary spin experiences a net phase change of zero during duration of application of two such pulses. However, for a spin that is moving $X_t = x_t(t)$ equation (7) becomes $$\phi_r = \gamma \int x_i(t) \, G_{xi}(t) dt. \tag{8}$$

For the case of steady flow $x_i(t) = x_i(0) + \nu t$ and hence:

$$\phi_r = \gamma x_i(0) \int G_{xi}(t) dt + \gamma \nu \int t G_{xi}(t) dt. \tag{9}$$

The first of these terms is zero because the time integral of $G_{x_i}(t)$ is zero. If rectangular pulses of magnitude $G_o$ are used such that $$G_{xi}(t) = -G_o \quad 0 < t < \tau_o \tag{10}$$
$$G_{xi}(t) = 0 \quad \tau_o < t < (\tau_o + \tau 1)$$
$$G_{xi}(t) = G_o \quad (\tau_o + \tau 1) < t < (2\tau o + \tau 1)$$

then $$\phi_r = \gamma G_o \nu (\tau_o^2 + \tau_o \tau_1).$$

In practice, it is important to ensure that the phase difference satisfies the relation $|\phi_r| < \pi$, otherwise 'velocity aliasing' may result. Another consideration is that although the maximum sensitivity to flow will be attained when $\tau_o$ and $\tau_i$ are as great as possible, they may not be extended indefinitely because of image degradation due to $T_2$ and $\Delta B_o$ effects.

Two and three-dimensional Fourier Transform (2-D FT and 3-D FT) methods are the most common MR image formation techniques currently in use. The Nuclear Magnetic Resonance (NMR) signal is digitally sampled using a phase sensitive detector, usually in phase and in phase quadrature. The image data is related to the signal or raw data, via a two or three-dimensional discrete Fourier Transform (2D-FT or 3D-FT), as described in, for example Callaghan, 1993, Chapter 3. In a 2D-FT sequence, denoting the signal as $S(k_x, k_y,)$ and the image data as $\rho(x,y)$, where r denotes the position vector in image space, and k the vector in the conjugate Fourier space, the interrelationship between $S(k_x,k_y)$ and $\rho(x,y)$ are as shown in equations 10 and 11:

$$S(k_x,k_y) = \int\int \rho(x,y) \exp(i2\pi k \cdot r) dx dy \tag{11}$$

and $$\rho(x,y) = \int\int S(k_x,k_y) \exp(-i2\pi k \cdot r) dk_x dk_y \tag{12}$$

Both S and $\rho$ are complex and are a Fourier conjugate pair. The space $(k_x,k_y)$ is often referred to as k-space. The variables $(k_x,k_y)$ are the time integrals of the magnetic field gradients $(G_x,G_y)$. In MRI, it is the magnitude of $\rho$ which is most often computed for image display, and the phase is discarded, in order to avoid image artifacts.

Fourier Optics describes the formation of an image by a lens system using the mathematical formalism of the Fourier Transform as described by Hecht, in 1987, (Chapter 11). Under well defined circumstances, a lens effectively acts as a Fourier Transformer of light scattered by an object. In turn, a second lens performs the inverse transform to form the image. There is a particular plane where the distribution of light is essentially a Fourier Transform of the light scattered by an object. This is often termed the transform or diffraction plane. For a two-dimensional object, parallel to the plane of the first and second lenses, the distribution of light in both the transform and image planes, can also be represented by 2D complex functions, and are related in the same way as in equations 10 and 11 above.

Phase contrast microscopy manipulates light in a so-called transform plane, by effectively inserting a "diffraction plate" in that plane. In a paper describing the principle of phase-contrast microscopy, Zernike proposed shifting the phase of the central area of the transform by 90° by means of a thin spot of transparent varnish deposited on a glass plate. Attenuation of the light passing through the spot was small. In a second paper a variety of alternatives were proposed, including an annular "phase-strip". Bennett et. al. (1951, Chapter 3) describe a design of commercially available phase-plates.

Manipulation of optical data in the transform plane, is equivalent to manipulation of Fourier MRI data in k-space. That is manipulation of a raw signal before Fourier Transforming it to form the MR image. In MRI this is done by mathematical operations on digitised raw data. Thus, shifting the phase of the NMR signal in the central area of k-space in MRI, is analogous to inserting a phase or diffraction plate in phase-contrast microscopy. The design of phase plates for phase-contrast microscopy takes into account the physical limitation of an optical system, while application of the principle to MRI must take into account the physical limitations of the MR imaging technique and hardware. Optical analogies are given which illustrate the theory and practice of phase-contrast imaging as applied to MRI.

In MRI, phase information is often displayed as a computed phase image (as for example by Young et. al, 1987). The phase p is calculated from the ratio of the real and imaginary parts of the complex signal (S) corresponding to each voxel. Thus:

$$\phi = \tan^{-1}(\text{Im}S/\text{Re}S) \tag{13}$$

In a computed phase-map the magnitude information is discarded, and it is often necessary to view the magnitude image at the same time in order to discern anatomical features. The phase-contrast technique effectively imports phase information into the magnitude image, thus displaying phase and magnitude contrast simultaneously.

In optical microscopy, phase-contrast techniques are of value in eliciting detail in samples which are virtually transparent, for example where the image is formed from transmitted light. In this case contrast may be available by virtue of differences in refractive index within a sample. The differences in refractive index result in differences in optical path length as light traverses the sample. Thus there are only small differences in the intensity of the light across the image, but substantial changes in phase. In MRI, a number of factors can cause a change in phase of the magnetization within a particular voxel. Grover and Singer (in 1971) were the first to argue that magnetization moving with a velocity v, along a magnetic field gradient G, would form a spin-echo phase shifted by:

$$\phi = \gamma G v \tau^2 \qquad (14)$$

relative to that formed by static material, when $\gamma$ is the Larmor frequency and $\tau$ is the separation of the 90° and 180° radiofrequency pulses. The same effect can be achieved by using a bipolar gradient in conjunction with a gradient echo sequence (Moran, 1982; Redpath et. al., 1984). The phase-shift can be used to measure the velocity of blood flow in vivo (Nayler et. al., 1986). Differences in magnetic susceptibility between tissues effect results in a phase-shift of the observed signal, provided that a gradient-echo sequence is used. Young et. al. (1987) demonstrated the clinical value of this technique in cases of intracranial haemorrhage. Chemical-shift effects between fatty $CH_2$ and water resident protons also result in a phase-difference between fatty and non-fatty tissues in gradient-echo images.

Figure 4A:
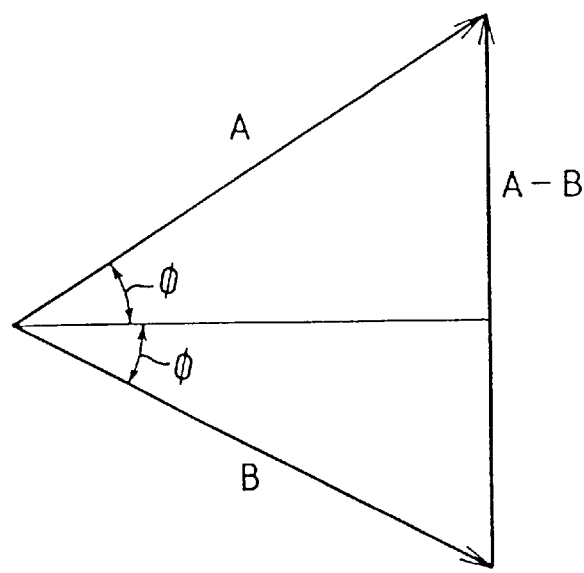
FIGS. 4a, 4b and 4c are vector diagrams.

An alternative method to computation and display of phase, is the use of a complex-difference technique similar to that first proposed by Bernstein and Ikezaki in 1991. If phase is to be used to quantify a parameter, for example velocity of a following blood bolus, then two measurements are often required. For instance, one measurement is made with a bipolar velocity phase-encoding magnetic field gradient pulse, and one is made without the pulse. Alternatively, one or each velocity pulse can be inverted to give an equal and opposite phase shift. The phase maps are then subtracted from each other to give the phase change due to the velocity encoding pulses alone, thus removing artifactual phase changes arising from other sources, such as poor static magnetic field homogeneity. Instead of subtracting phase, the complex difference technique subtracts complex signals A and B directly, as shown in FIG. 4a. Thus some magnitude information is preserved for moving nuclear spins.

The MRI phase-contrast method proposed, and also optical phase contrast methods, are based on the following principle.

Figure 4B:
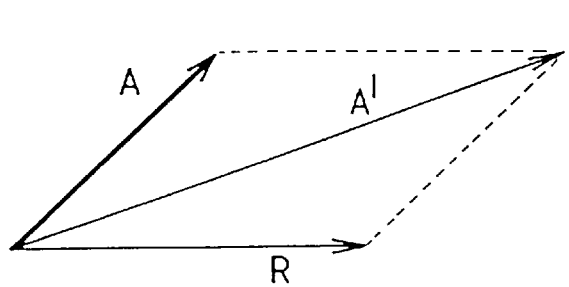
Figure 4C:
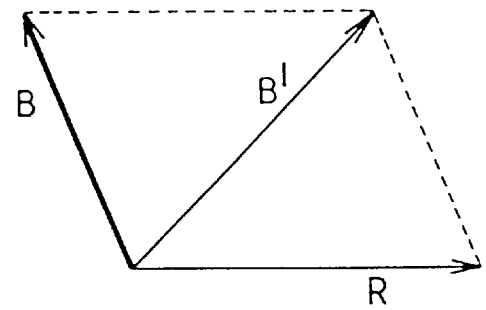

Consider two complex numbers A and B, corresponding to two different positions in image space, and representing either the electromagnetic field (in optics) or transverse magnetisation (in MRI). Both A and B are of approximately equal magnitude, so that magnitude images will show little contrast. FIGS. 4b and 4c shows how the addition of a third constant background or reference constant R can elicit contrast in a magnitude image. Thus $$A' = A + R \qquad (15)$$

and $$B' = B + R \qquad (16)$$

It is apparent that the resulting complex numbers A' and B' have very different magnitudes.

In MRI the reference R can be added to the complex image data after obtaining the FT of raw data, and before taking the magnitude of each pixel. Alternatively the operation can be performed in k-space by addition of a complex constant R to the dc or k(0,0) point. Thus the change to the image value $\rho$ is given by $$\Delta\rho(x,y) = \int\int R\delta(0,0)\exp(-i2\pi k_r r) dk_x dk_y \qquad (17)$$

or $$\Delta\rho(x,y) = R \qquad (18)$$

which is equivalent to adding a complex constant to every point in image space. In optics the dc point in the transform plane is manipulated by a phase plate, as outlined above. In Zernike's original paper, a simple 90° phase-shift of the light passing through the central area of the transform plane was proposed. In practice attenuation as well as phase-shifting are used in modern microscopes (Bennett et. al., Chapter II). Both can be regarded as equivalent to the addition of a constant complex reference background constant R in image space.

The complex-difference method requires the acquisition of two sets of data and is therefore at a potential disadvantage compared to the phase-contrast method according to this invention, which can be implemented with only one set of data. However, unlike the phase difference method, the method of the present invention is not immune to artifactual changes in phase across the imaging field-of-view (FOV).

In image space, phase-contrast can be achieved by the addition of the complex reference constant R to every pixel value. This is straightforward to implement provided the image is free of artifact.

The implementation of the technique in k-space has the advantage of computational speed, in that only one point of the raw data need be modified. The image is then formed by taking the FT of the raw data. Since this step has to be done anyway, the excess computation required over that needed to form a conventional magnitude image, is minimal.

In 2D-FT or 3D-FT MRI, the central data point of the complex raw data array may not be the effective dc point, for a number of reasons. This results in an artifactual phase-gradient across the image. This effect will dominate phase-contrast effects made visible by the addition of the reference constant R, so that the subtle shifts due to susceptibility and velocity which are of value, will not be seen. This point is discussed in detail below for a gradient-echo image.

Figure 5:
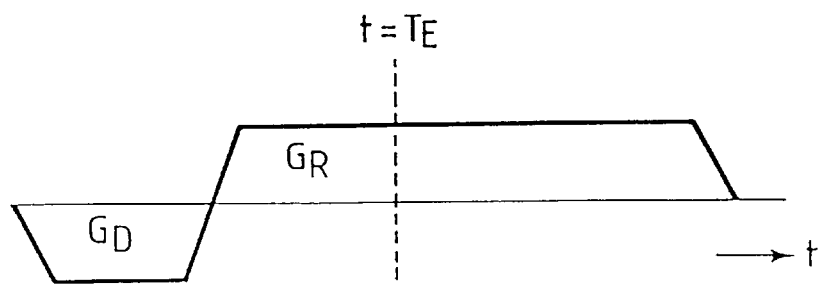
FIG. 5 is a graph of a gradient switching sequence.
Figure 6A:
FIGS. 6a–6l show images of an aortic arch obtained using only magnitude of data signals without phase encoding.
Figure 6B:
Figure 6C:
Figure 6D:
Figure 6E:
Figure 6F:
Figure 6G:
Figure 6H:
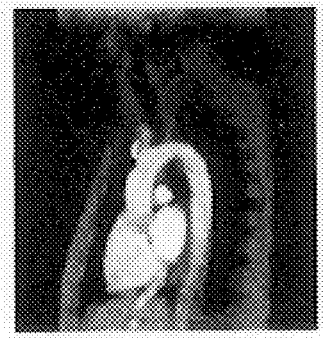
Figure 6I:
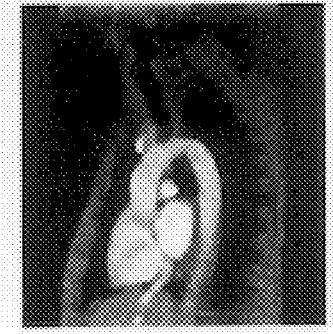
Figure 6J:
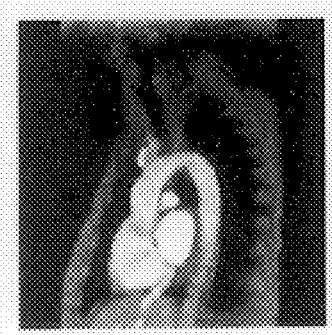
Figure 6K:
Figure 6L:
Figure 7A:
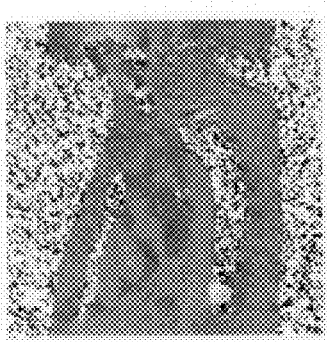
FIGS. 7a–7l show images of an aortic arch obtained using only phase differences of output signals in which the phase-difference map is devoid of unwanted phase artifact.
Figure 7B:
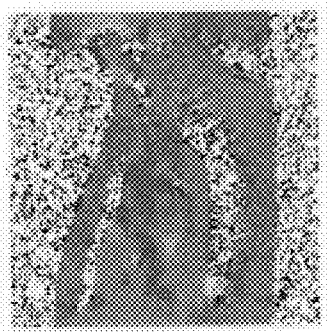
Figure 7C:
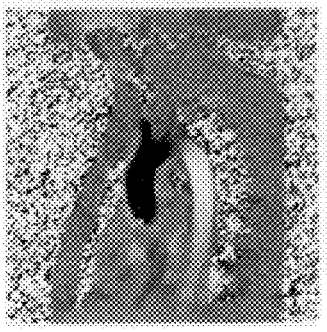
Figure 7D:
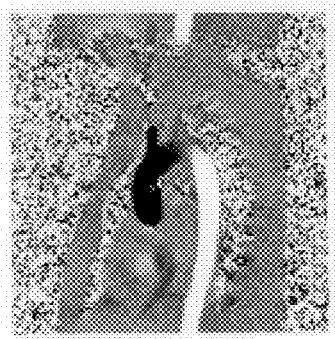
Figure 7E:
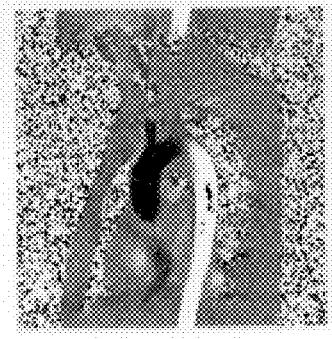
Figure 7F:
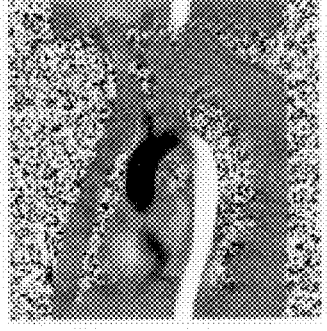
Figure 7G:
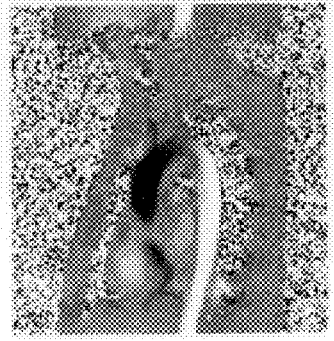
Figure 7H:
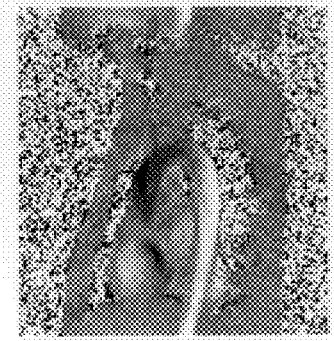
Figure 7I:
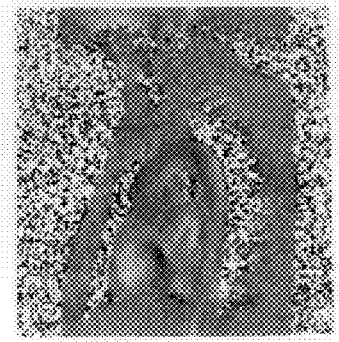
Figure 7J:
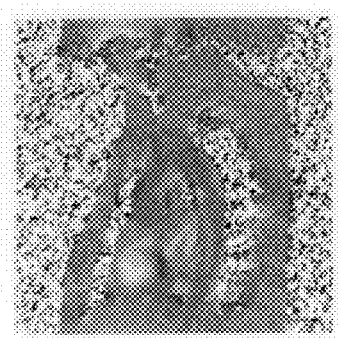
Figure 7K:
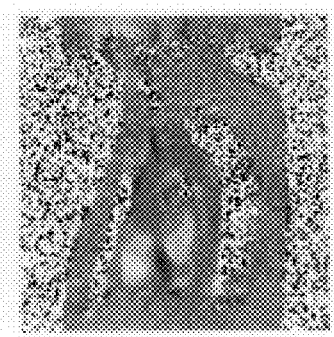
Figure 7L:
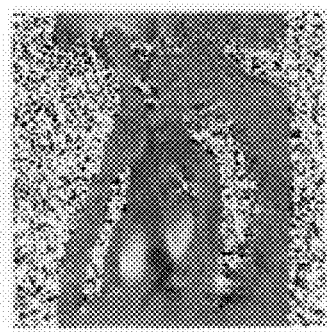
Figure 8A:
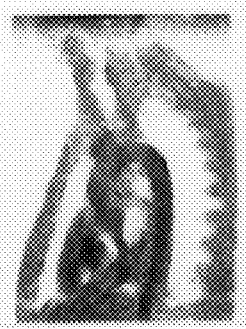
FIGS. 8a–8l show phase contrast images of aortic arch obtained using the present invention, the constant background vector having been chosen to highlight contrast between the aorta and the background.
Figure 8B:
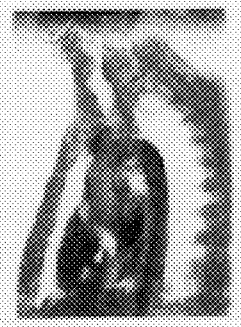
Figure 8C:
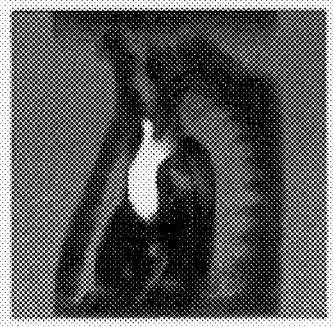
Figure 8D:
Figure 8E:
Figure 8F:
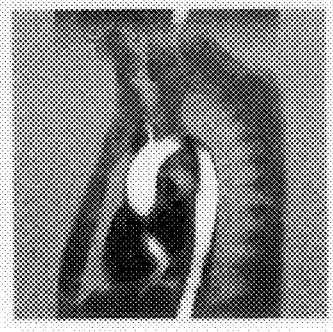
Figure 8G:
Figure 8H:
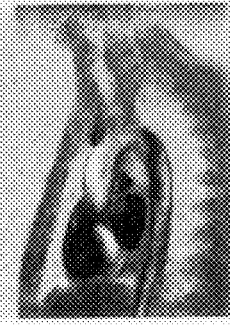
Figure 8I:
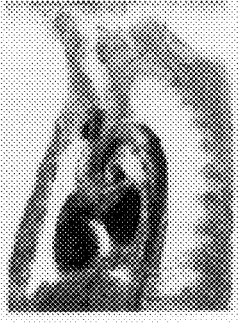
Figure 8J:
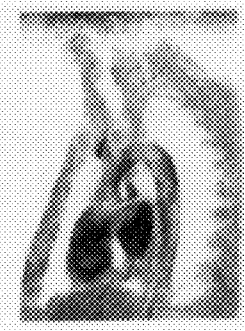
Figure 8K:
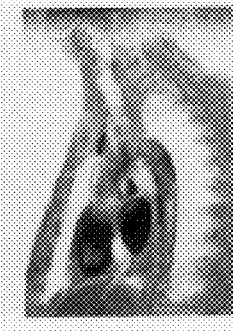
Figure 8L:
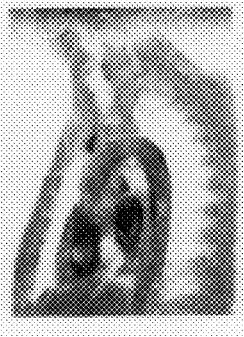

Consider a 2-Dimensional gradient-echo image acquired with an inhomogeneous static magnetic field. The form of the readout or frequency-encoding gradient waveform is shown in FIG. 5.

To a first-order approximation the static field error $\Delta B_o$ can be considered as the sum of a constant term, and three gradient terms, along the frequency-encoding (x), phase-encoding direction (y) and select (z) direction as expressed below by:

$$\Delta B_o = E + \frac{\delta B_o}{\delta x}x + \frac{\delta B_o}{\delta y}y + \frac{\delta B_o}{\delta z}z \qquad (19)$$

The effect of the invariant term E is to add a constant phase offset across the field of view. The effect of the second term, the term in x, is to shift the position of the spin-echo. With reference to FIG. 5, this can be understood by imagining the effect of an offset to the gradient waveform, of an amount equal to the term in x. Suppose that the offset is positive, then the size of the dephasing area $G_D$ will be diminished, and the size of the rephasing gradient increased, so that the echo occurs at an earlier time. That is the effective TE is reduced. This results in a shift of the gradient echo signal along the frequency-encoding direction in k-space. By the shift theorem for Fourier Transforms, this results in a phase-gradient along the frequency-encoding direction in image space, proportional in size to the size of the shift in k-space.

A similar argument also applies for echo shift in the phase-encoding direction. In the absence of a static field error, the maximum signal is obtained for a zero phase-encoding gradient pulse amplitude i.e. the dc point is located on the line $k_y=0$. In the presence of a static field error with y dependence, this is not the case. Maximum signal is obtained when the phase-shift caused by the phase-encoding pulse is cancelled by the shift caused by the term in y in equation 19. The effect of the term in z is simply to displace the position of the selected slice and reduce the amplitude of the signal by introducing a phase-dispersion through the slice.

The arguments for field errors in x and y are entirely equivalent to regarding the phase error $\Delta\phi$ in the reconstructed image as:

$$\Delta\phi = \gamma \cdot \Delta B_O \cdot TE \qquad (20)$$

In addition to the static field error outlined above, a phase-gradient can be introduced into gradient-echo and spin-echo images by failure to centre the signal observation interval on the echo-position at t=TE. This can result from mis-setting the gradient dephase pulse amplitude $G_D$, or it can result from a deliberate use of a large $G_D$ value to form the echo early, to minimise flow-related phase shifts, or $T_2^*$ spin-dephasing effects.

Artifactual phase-gradients across the image can be removed by the use of spin-echo sequences which rephase the effects of static field inhomogeneities. However, depending on the method used this may remove any phase changes due to susceptibility contrast between different tissues which may be of interest.

Practical implementation of the phase-contrast technique therefore requires either the removal the phase-gradient in image space, or an implementation which can operate in the presence of phase-gradients. Phase-correction methods for image space data are available. Ahn and Cho (1987) described a first-order technique (i.e. phase-gradients are corrected, but not second-order derivatives) which calculates an image auto-correlation function to estimate the gradients present in the image. A technique employing second and higher order corrections is also available, but is not generally applicable to gradient-echo images with both fat and water protons in the field of view (Bernstein et. al., 1989). An alternative approach is to perform the operation in k-space. Instead of adding a complex constant R to the central point at k=(0,0), as outlined in equation 16 and 17, the constant is added to a point ($k_x'$, $k_y'$). This results in a background vector R with variable phase since $$\Delta\rho(x,y) = \int\int R\delta(k_x',k_y')\exp(-i2\pi k \cdot r) \, dk_x dk_y \qquad (21)$$

so that a complex background $$\Delta\rho(x,y) = R.\exp(-i2\pi(k_x'x + k_y'y)) \qquad (22)$$

is added to the image space data after Fourier Transformation of the modified raw data set. If the phase-gradient in A p matches the existing average artifactual phase-gradient in image space, then there is, on average, a constant phase difference between the background vector and the image. The complex background vector therefore enhances contrast arising from non-artifactual phase differences which are still present in the data. This method is therefore equivalent to the phase-correction method as applied in image space, which aims to ensure, on average, a constant phase difference between background and image by removing artifactual phase-gradients in image space, and uses a background of constant phase. The choice of ($k_x'$, $k_y'$) can be made, to a first approximation, by finding the point in k-space with the maximum signal magnitude.

The background constant R will usually be chosen to maximise the contrast-to-noise ratio between two tissues in the final magnitude image, or two neighbouring areas of the image. Given that there are two degrees of freedom in the choice of R, an initial guess to its best value may be required to avoid lengthy interactive searching by trial and error. For two regions or tissues, with signals A and B, this choice can be made by maximising the function $$C = |A+R| - |B+R| \qquad (23)$$

provided that the magnitudes of (A+R) and (B+R) are large compared to the background noise level. A plot of C versus the magnitude and phase of R allows a suitable value to be estimated. In the case where the magnitude one of (A+R) or (B+R) are of the same order as the background noise, then the analysis may be more complicated. This is due to the rectification of Gaussian white noise at very low signal levels (Edelstein et. al., (1984)).

A further embodiment of the invention will now be described with brief reference to FIGS. 6 to 8. It has already been mentioned above that one way of overcoming the problem of motion artifact in MRI imaging is to obtain two image sets, one with no phase change due to moving material, the other with motion encoded as a phase change. Provided the sequences are well designed, the artifactual phase errors will be identical in both images sets. This technique is well described by Naylor et al. Subtraction of the phase maps calculated from each set, leaves phase changes from the motion encoding alone.

In the present invention a new image set of data has been obtained by the following steps:

Firstly by calculating a conventional magnitude image (i.e. by taking the magnitude Fourier Transform of the raw data) using the data which is not motion encoded; then multiplying each pixel by $\exp(i.\Delta\phi)$, where $\Delta\phi$ is the phase change due to the velocity alone i.e. $\Delta\phi$ is the phase from the phase difference map described above. This produces a complex image data set where the phase information depends on motion alone, and has had phase artifacts removed so that the methods of phase-contrast display outlined above can now be applied, either in image space, or in k-space, after having re-transformed the data.

The images shown in FIGS. 6a–6, 7a–7l and 8a–8l show that the technique works, and that it shows promise in displaying data more readily than by jointly viewing magnitude and phase-difference images. The images show from i.e. FIGS. 6a–l, 7a–l and 8a–l, respectively, the heart and aortic arch in 50 ms steps after ECG R-wave detection. Flow is seen in the aorta in the FIG. 6c, after the aortic valve opens. At the end of the cycle at FIG. 6l, aortic flow has ceased.

Figure 9:
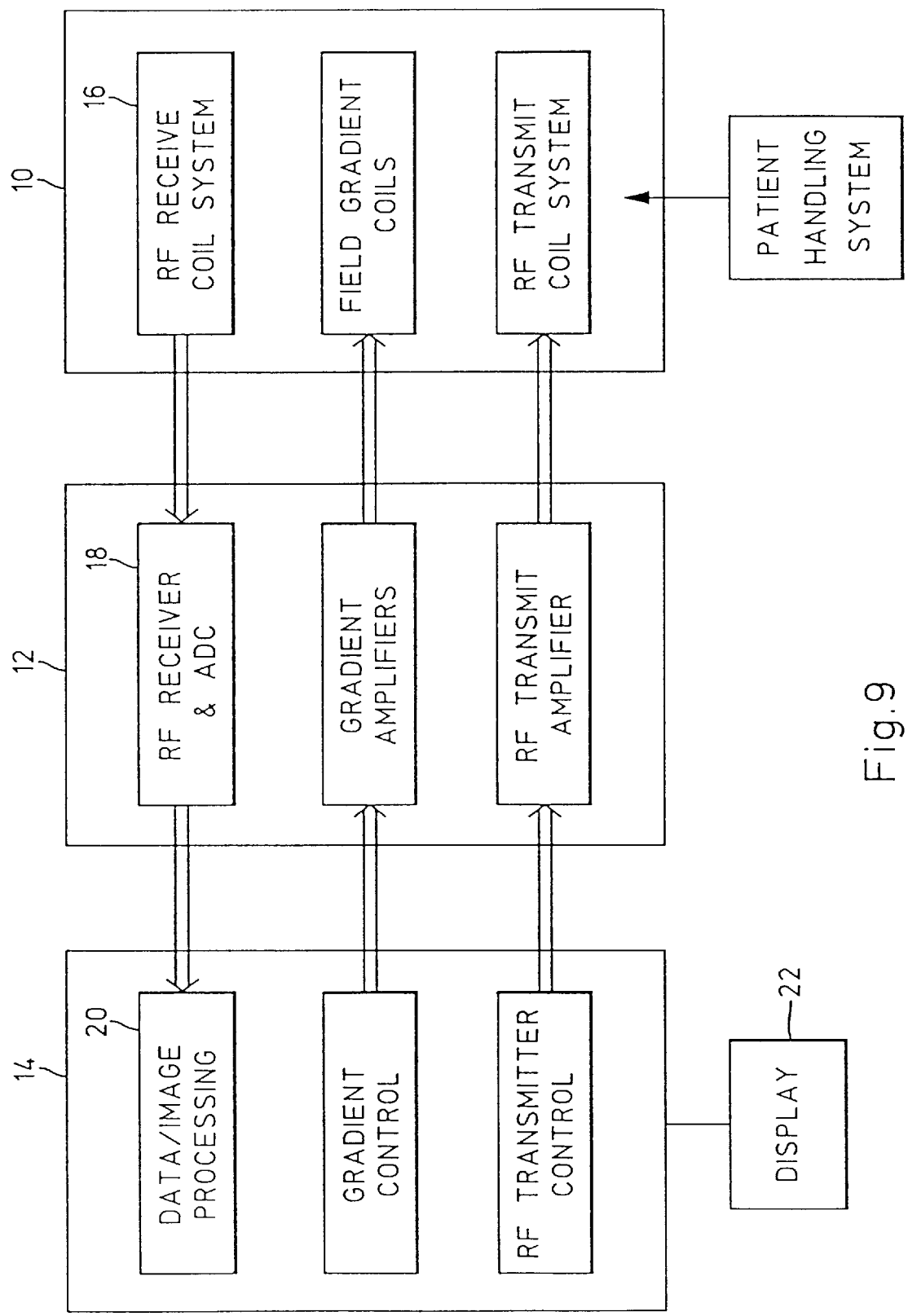
FIG. 9 shows a block diagram of a system incorporating the invention.
Figure 10:
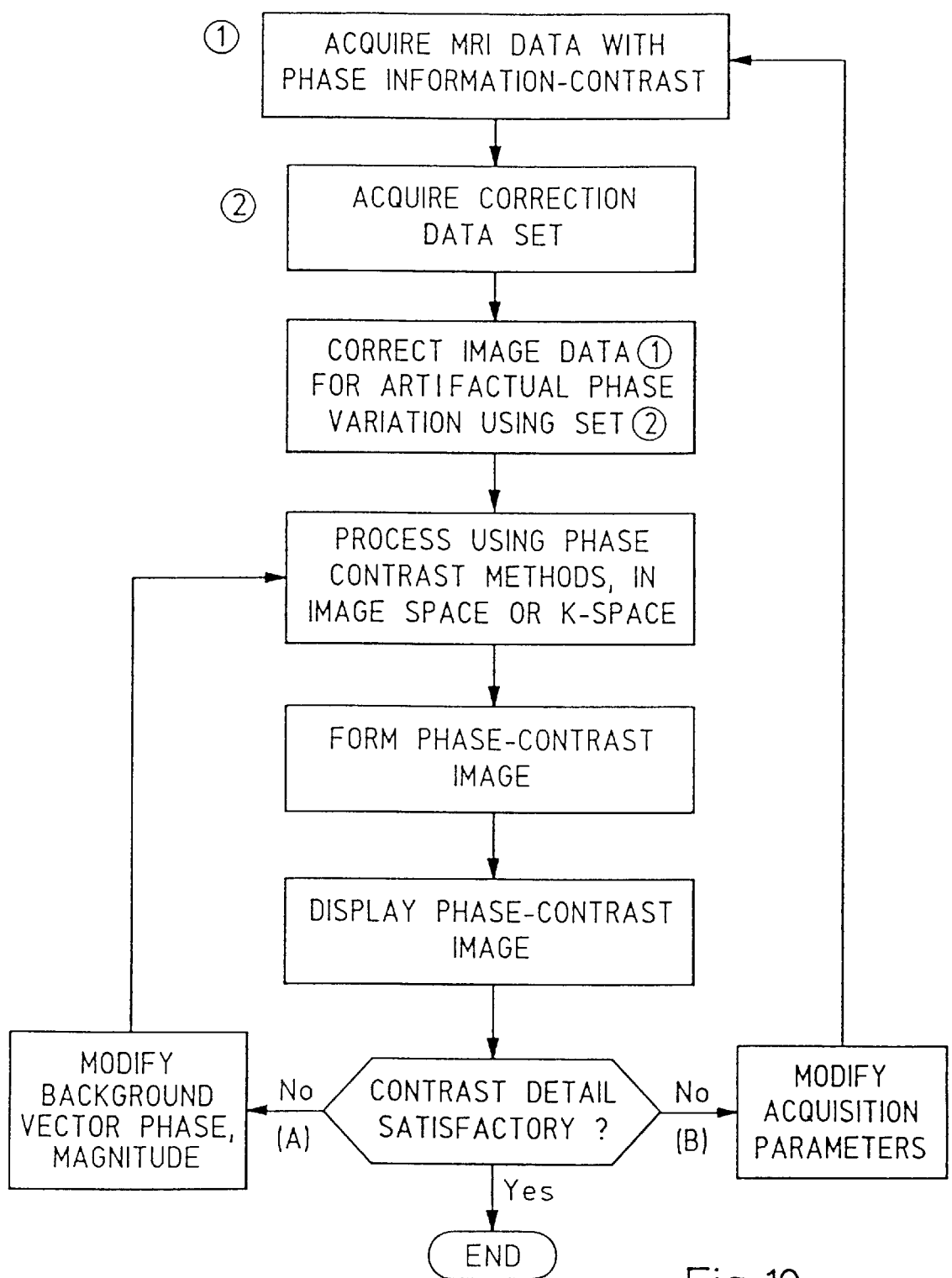
FIG. 10 shows a flow diagram of key steps in the method of obtaining data.
Figure 11:
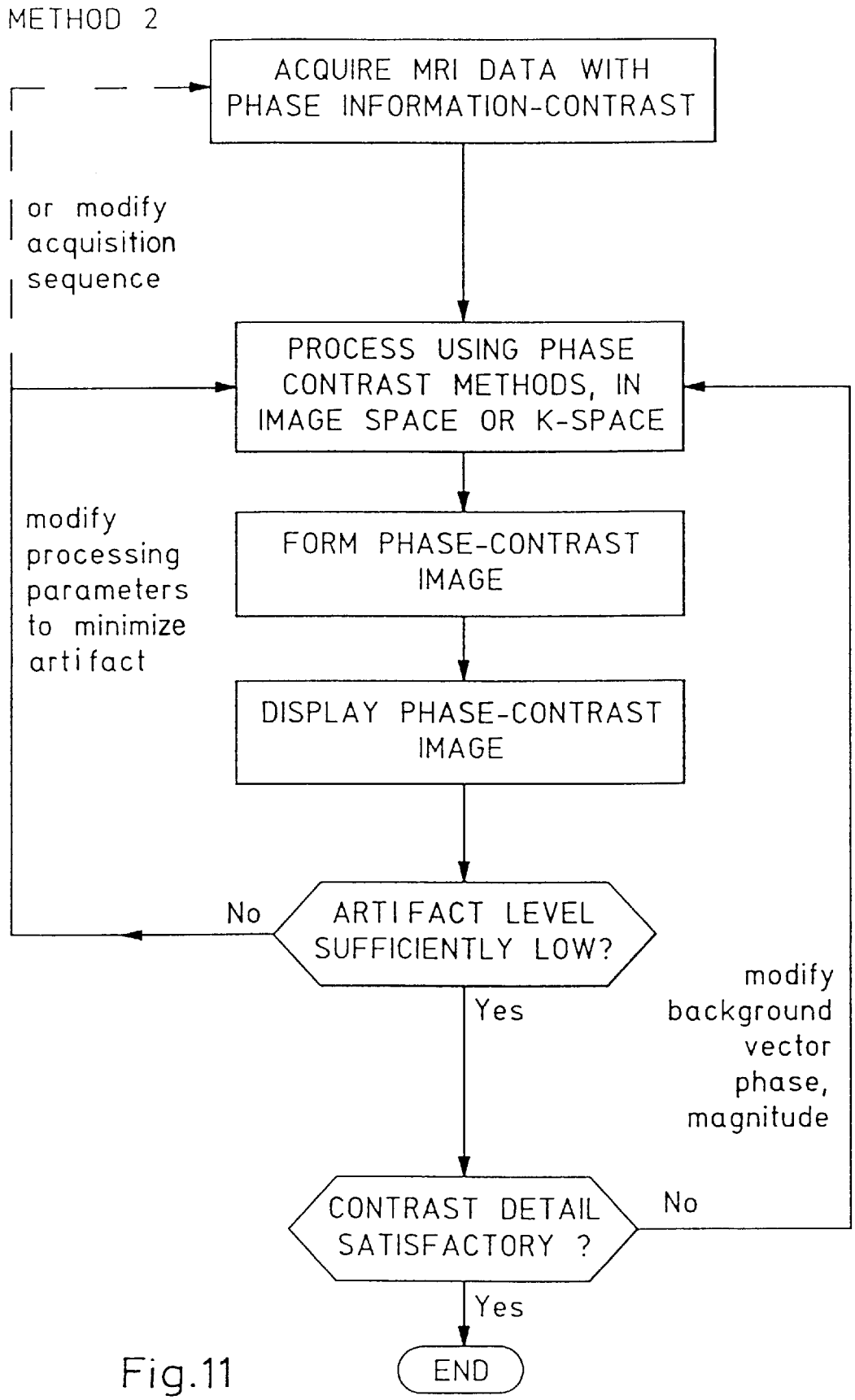
FIG. 11 shows diagrammatically an alternative method.

The invention is now further described with reference to FIGS. 9, 10 and 11. Magnetic Resonance Imaging (MRI) apparatus 10, together with electronic control apparatus 12 and a host computer 14, is capable of producing magnetic field gradients and applying radio frequency (rf) pulses. Induced voltages obtained from dephasing nuclei, in an object (not shown), which is being imaged, are induced in coils 16 in the MRI apparatus 10.

Induced voltage signals are captured by RF receive and converted to digital data by an analog-to-digital converter 18 (ADC) and data is then sent to processing system 20. One way in which the information is used to produce an image, which is displayed on a screen 22, of a monitor, is to obtain first and second image data sets. This method is illustrated in FIG. 10. The second image data set is obtained shortly after the first image data set. The two data sets undergo mathematical processing which incorporates a Fast Fourier Transform. Phase shifting is then effected digitally on one of the two image data sets.

The procedure will now be described in greater detail with specific reference to FIG. 10. A converted image is obtained using the second image data set. Phase contrast techniques, as described above, are performed on the data sets in image or k-space. A phase contrast image is then obtained and an image is displayed. Optionally a radiographer is able to enhance an image at this stage using conventional image enhancement techniques or a digital image may be stored electronically. Alternatively if an image is considered to be unsatisfactory the radiographer may intervene in the imaging process and recommence the cycle, as indicated by decision box in FIG. 10.

An alternative method is now described with reference to FIG. 11. An image data set with phase contrast information is obtained. Phase contrast enhancement is performed on the data sets in k-space as described above. A phase contrast image is obtained on a monitor. If the artifact level of the image is sufficiently low and the contrast detail is satisfactory the image is displayed and/or stored. However, if there are high levels of phase artifact the process parameters may be modified or, as is illustrated by the dotted line, a fresh set of data may be obtained. Similarly if the contrast detail is poor the phase and/or magnitude of the background vector may be modified. Such modifications are carried out by a skilled radiographer.

An embodiment incorporating the above mentioned Schlieren technique will now be described with reference to FIGS. 12 to 14.

In optics, phase-contrast microscopy is a method of visualising structure in objects which are practically transparent, where, as a result, little information is available in the intensity of the transmitted light. Differences in refractive indices within the object, and hence in the optical path lengths of the transmitted light, result in phase contrast in the final image. Conventional optical techniques discard this information and are sensitive only to the intensity of the light forming the image. Phase-contrast and Schlieren methods are techniques which exploit these phase differences to generate contrast. In magnetic resonance imaging, as mentioned above the signal phase is also often discarded when displaying data, despite the fact that it may contain information on blood flow velocity, chemical shift and tissue magnetic susceptibility. The implementation of the magnetic resonance imaging analogues of phase-contrast and Schlieren optical techniques and present images of blood flow in the human aorta are described in detail below, as an illustrative example.

Figure 12:
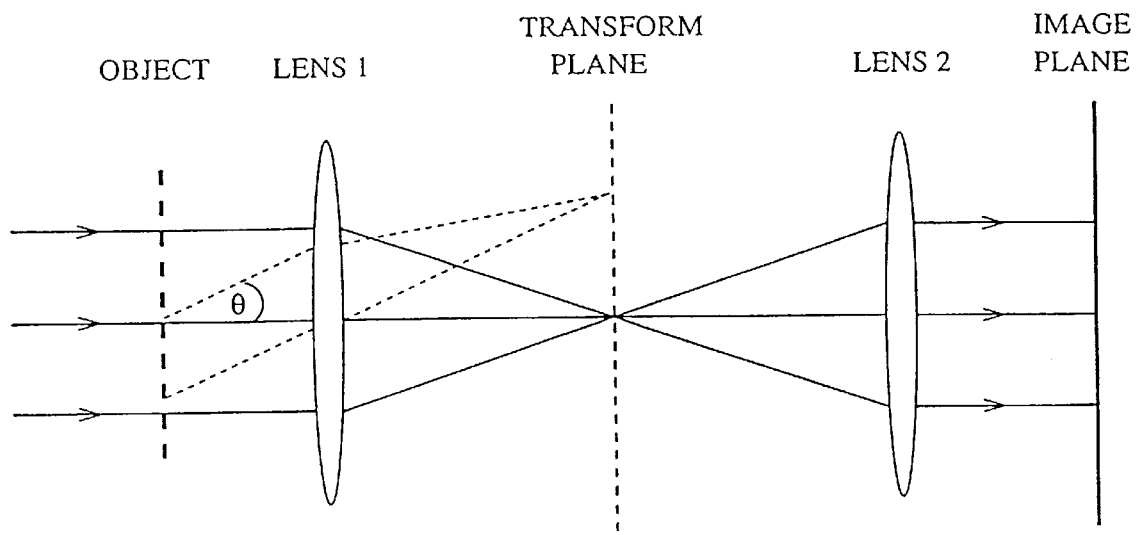
FIG. 12 shows the distribution of light in the transform plane is a 2D Fourier transform of light transmitted by the plane object and focused by the first lens.
Figures 13, 14:
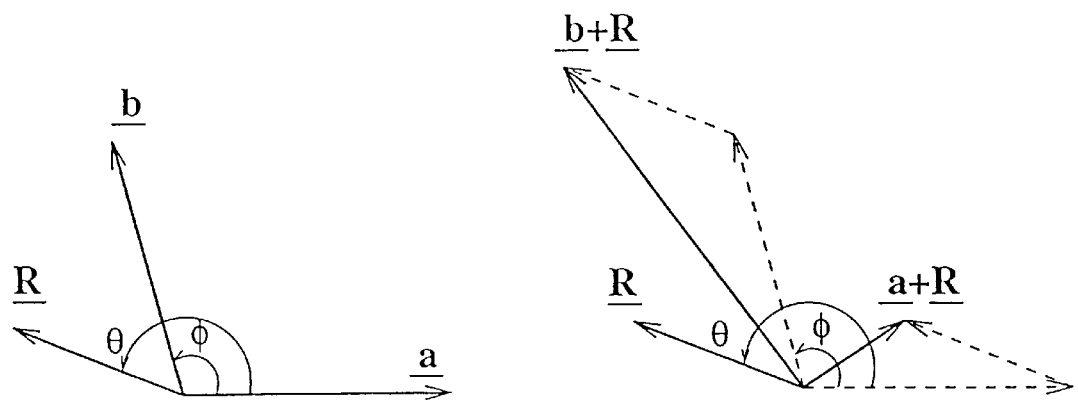
FIG. 13 shows the addition of a background vector R in image space elicits contrast in the magnitude of the resulting vectors in two regions with similar signal ma des but different phases.
FIG. 14 is a vector diagram.

FIG. 12 illustrates the optical principle of the phase-contrast technique. Solid rays 100 show undiffracted monochromatic light transmitted by object 102 focused in the centre of the transform of diffraction plane 104. Broken rays 106 show light diffracted by the object 102 being focused at a point offset from the centre. A first lens 108 can be considered to yield a two-dimensional Fourier transform of light from the object 102 in the transform plane, while a second lens 110 carries out a second Fourier transform to give the image. This is equivalent to Abbe's theory of image formation which states that: "plane monochromatic wavefronts are diffracted by the object and yield a Fraunhofer diffraction pattern in the focal plane of the first lens".

Points in the transform plane can be viewed as point sources of Huygen's wavelets so that a second diffraction pattern is created at an image plane 112. Thus the image is formed by a two stage diffraction process.

Phase-contrast methods phase-shift, and may attenuate, the undiffracted or zeroth order beam by using a phase-plate in the transform plane. (Zernike originally accomplished this by means of a small central spot of varnish on a glass plate). In Schlieren methods the phase plate is replaced by a knife-edge which completely attenuates or stops one-half of the light in the transform plane.

In magnetic resonance imaging (MRI), the electrical signals observed at a receiving coil are effectively Fourier transforms of an object under investigation. Signals are sampled in-phase and quadrature so that raw data is effectively complex, having both magnitude and phase. The raw data is often referred to as k-space data since, for a two-dimensional image, the nuclear spin distribution is given by $$\rho(x,y) = \int \int S(k_x,k_y)\exp(-ik.r)dk_x dk_y \quad (24)$$

where $k_x$ and $k_y$ are the respective time integrals of the frequency (x) and phase encoding (y) gradients at the time of signal (S) observation and $$k.r = k_x x + k_y y \quad (25)$$

Thus k-space data in MRI is the analogue of the distribution of the amplitude and phase of light in the optical transform plane of FIG. 12. As in optics, MR images are often formed from the magnitude of the Fourier transform, so that phase information is discarded.

The effect of an optical phase-plate can be achieved in MRI by manipulating the $(k_x,k_y)=(0,0)$ data point, sometimes called the "dc point", before taking the Fourier transform of the data set to form the image. The MRI Schlieren method is implemented by setting one-half of the k-space data to zero before transformation, equivalent to a complete stop in optics. Alternatively, the phase of the complex signals may be changed by $\pi$, effectively obtaining phase reversal.

In optical phase-contrast methods, the observer is restricted to attenuating and phase-shifting the dc point by means of the phase plate. In MRI however, the dc data point can be manipulated at will. In MRI it is useful to consider the manipulation as the addition of a complex constant R to the dc point, to reflect the freedom of change available to the observer. The addition of R to the dc point is equivalent to the addition of a background reference complex constant R across at entire field-of-view of the image plane 112, since the change in the nuclear spin distribution image is $$\Delta\rho(x,y) = \int \int R\delta((k_x-0),(k_y-0))\exp(-ik.r)\,dk_x dk_y = R \quad (26).$$

Consider two regions of interest within the image with signal vectors A and B of similar magnitude but different phase, where the shape of the interface between them is of interest. FIG. 14 illustrates how the addition of a background vector R gives rise to a difference in their resultant magnitudes, thus giving rise to contrast in the magnitude MR image. Ideally R should be chosen to maximise the contrast, thus:

$$C=||A+R|-|B+R|| \qquad (27)$$

The principles outlined above were tested on a 1 Tesla Siemens scanner by encoding velocity information into the phase of a gradient-echo image of the aortic arch of a normal volunteer using the method outlined by Nayler (Nayler G. L., Firmin D. N., Longmore D. B., J. Comp. Asst. Tomog. 10, 715–722 (1986)). Image acquisition was synchronised to the electrocardiogram (ECG), and 12 cine gradient-echo images obtained at 50 ms intervals, beginning immediately after the R-wave. Two image sets were obtained, one without velocity encoding, the second so that a phase shift of $\pm\pi$ corresponds to motion of $\pm 1.0$ ms$_{-1}$ in the head-to-foot direction. This limit is chosen to exceed the velocities encountered in vivo, to avoid velocity aliasing. The sign of the phase shift is determined by the direction of motion. The slice thickness is 10 mm, the flip angle 30°, the matrix 256×256 with 3 signal averages.

Phase-contrast and Schlieren methods cannot be applied directly to the velocity encoded set as the phase information is contaminated with errors caused by static field inhomogeneity. The phase shift $\Delta\phi$ between the two sets of information (magnitude and phase), corresponding to velocity encoding alone, is calculated on a pixel by pixel basis, and a corrected image set formed by calculating $$\rho_c(x,y)=|\rho(x,y)|\exp(i\Delta\phi(x,y)) \qquad (28)$$

where $|\rho(x,y)|$ can be either the encoded or un-encoded image set. Fourier transformation then yields a corrected k-space data set for the Schlieren method to be applied. The phase-contrast method can be implemented in either k-space or image space (see equation 26). To save time, the un-encoded set can be acquired at a lower spatial resolution, as the phase contamination induced by static field inhomogeneities is only slow varying in space. In this case the encoded image data would be used to calculate $|\rho(x,y)|$.

Conventionally, phase information in MRI is viewed by displaying magnitude images $|\rho|$ in conjunction with computed phase maps. An alternative approach to visualise blood flow in MRI is to acquire two data sets, one with positive velocity encoding $\rho_+$, the other with negative velocity encoding $\rho_-$, and to display the magnitude of their complex difference $|\rho_+ -\rho_-|$. This has the disadvantage of suppressing stationary tissue so that the relative position of blood vessels to the surrounding anatomy is lost.

Figure 14A:
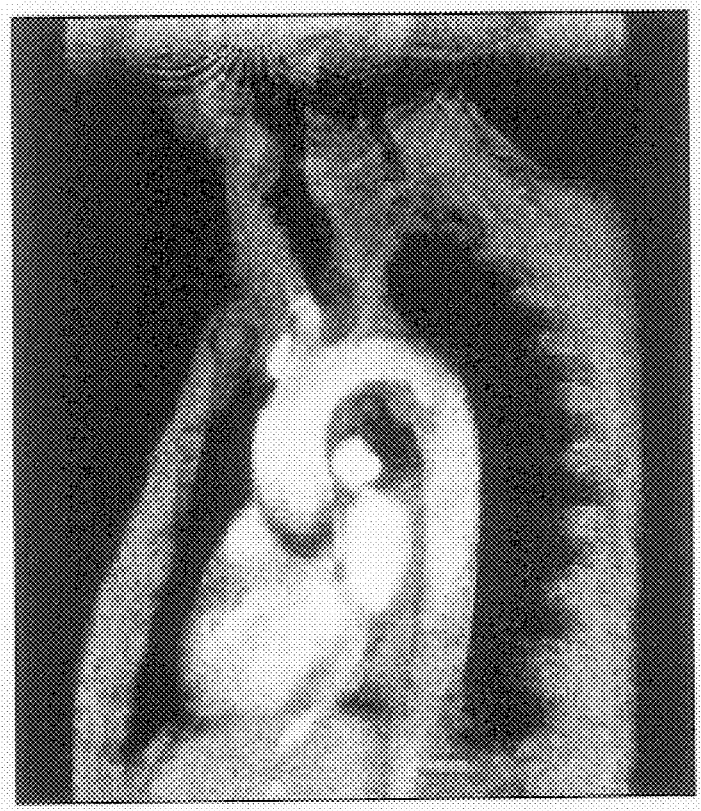
FIG. 14a shows diagrammatically the Magnitude Fourier transform magnetic resonance image.
Figure 14B:
FIG. 14b shows the computed phase magnetic resonance image.
Figure 14C:
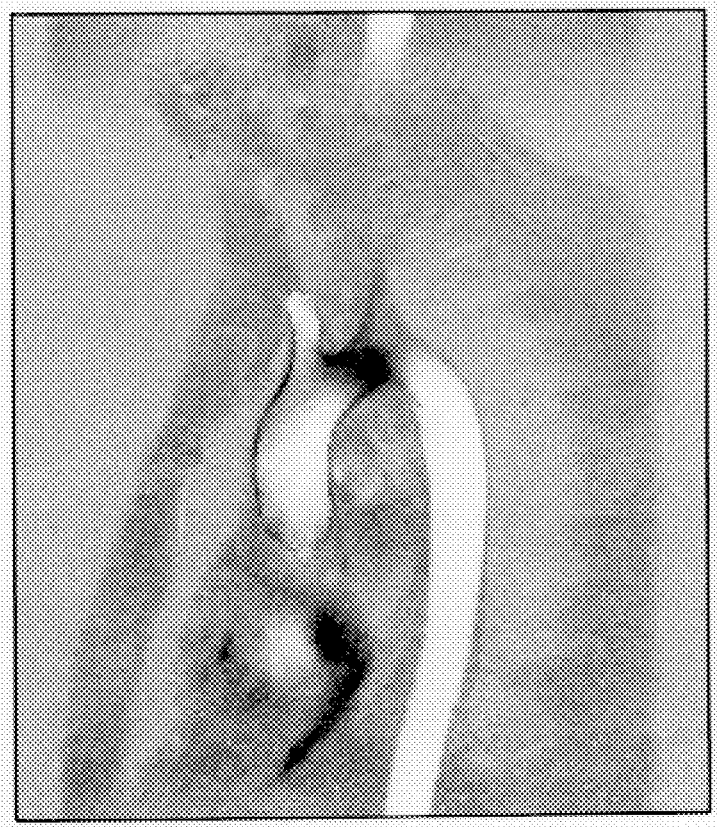
FIG. 14c shows the phase-contrast magnetic resonance image.
Figure 14D:
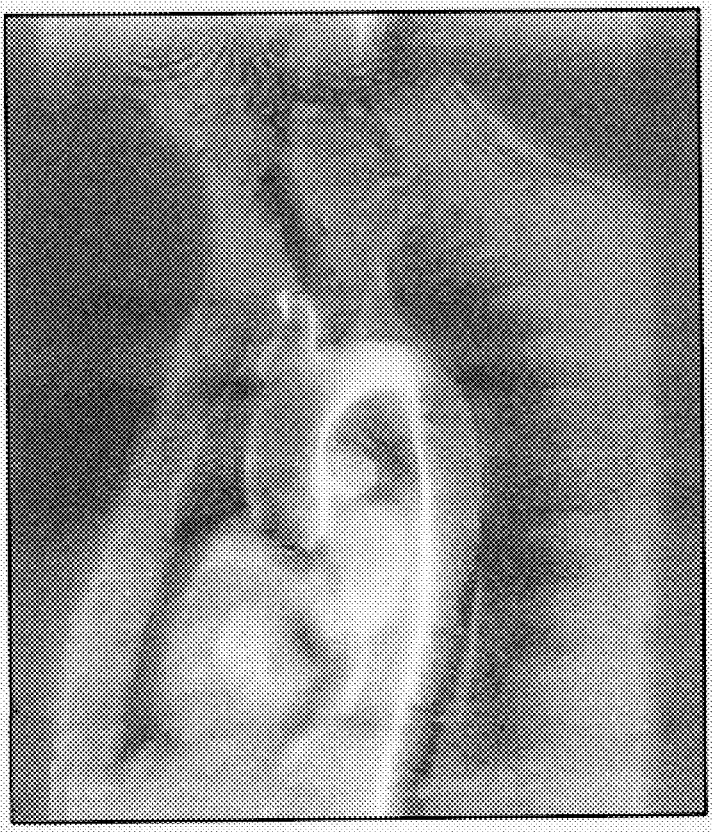
FIG. 14d shows a "stopped" Schlieren magnetic resonance image.
Figure 14E:
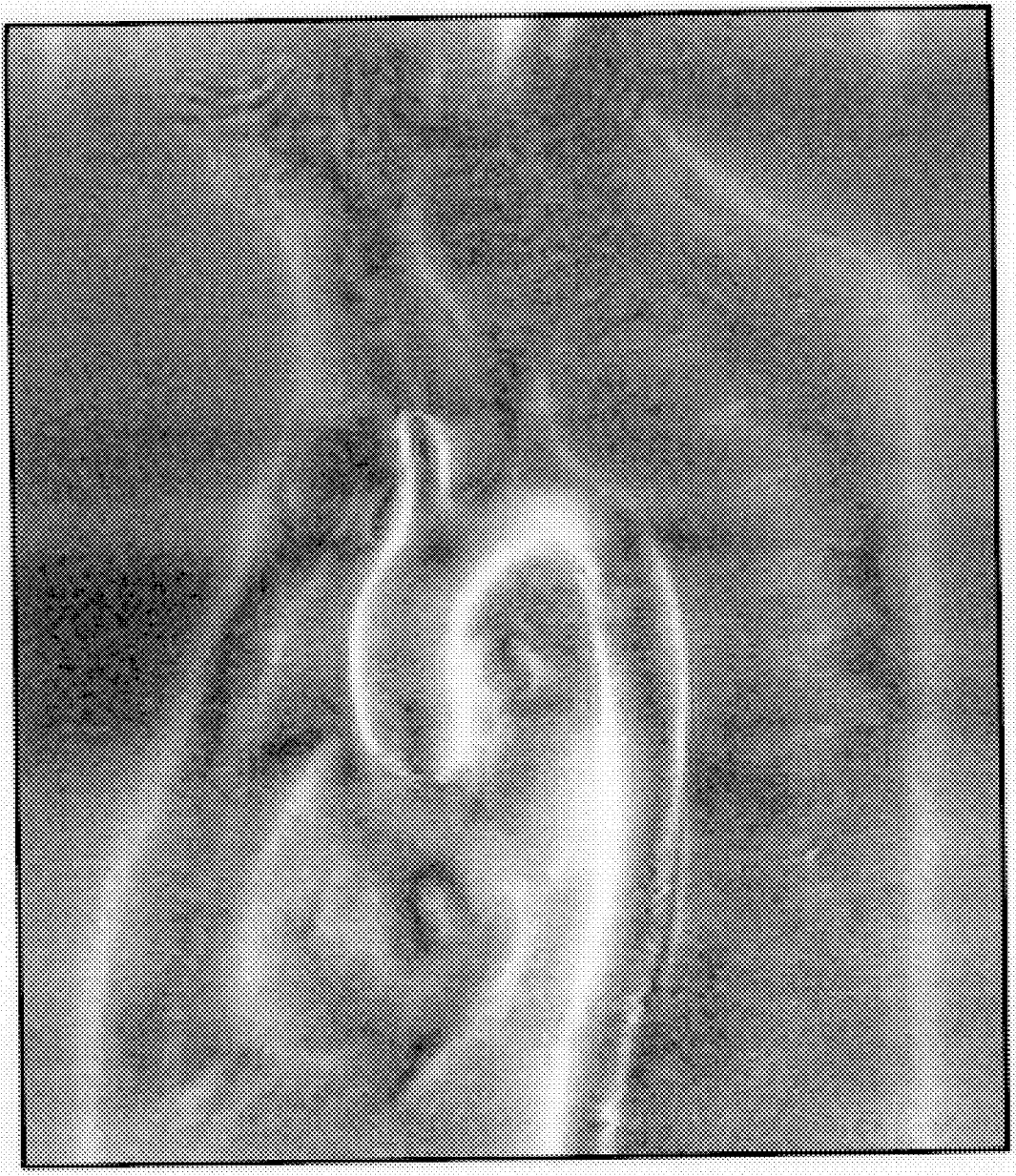
FIG. 14e shows a "phase-reversed" Schlieren cine magnetic resonance image, all of FIGS. 14 and 14a–14e are of the aortic arch of a normal volunteer obtained with a delay of 150 ms after the ECG R-wave.

FIGS. 14a and 14b show respectively magnitude and computed phase-difference images for the 4th cine frame of the corrected image set, acquired 150 ms after the R-wave, at the onset of systole. The random phase of the noise in low signal areas is distracting, but may be removed by magnitude masking. FIG. 14c shows the phase contrast image with the background vector chosen to maximise contrast between blood flowing in the ascending aorta, and slower moving blood in the left ventricle. It is interesting to note the lack of contrast between the aortic wall and the top of the arch where there is no component of velocity in the head-to-foot direction, and hence no velocity-encoded phase shift. Good wall-blood contrast is seen elsewhere, especially in the ascending aorta. FIGS. 14d and 14e show the Schlieren images obtained by respectively i) setting the $k_y<0$ half of the k-space data to zero and ii) 'phase-reversal' of the same portion of the raw data. The y direction is anterior-posterior and is the spin-warp phase-encode direction. In this case the effect of the Schlieren processing is to emphasise phase boundaries at right angles to y. Rotation of the cut-off edge in k-space rotates the directionality of the phase-boundary enhancement effect. The stopped Schlieren image emphasises only the inner surface of the curve of the aortic arch, while the 'phase-reversed' image emphasises both inner and outer surfaces.

Phase-contrast and Schlieren MRI offer methods of integrating phase and magnitude information into a single MR image, with the potential of emphasising structural and functional detail which may not be readily visible by conventional MR imaging techniques.

The invention has been described by way of examples only. It will be appreciated that variation to the above embodiments may be made without departing from the scope of the invention.

What is claimed is:

1. A method of Magnetic Resonance Imaging an object, comprising:

exciting magnetic resonance in the object;

acquiring magnetic resonance response signals in the form of an acquired complex data set containing magnitude and phase information;

adjusting the acquired data set, in complex form, by adding a complex constant to the acquired data set to generate an adjusted complex data set also containing magnitude and phase information; and generating an image data set in dependence on magnitude values derived from the adjusted data set, wherein the adjusting the acquired data set is such as to enhance contrast between two regions of interest in the image data set in dependence on the relative phases for the two regions.

2. A method according to claim 1, wherein the complex constant is selected so as to maximize the contrast between the two regions of interest.

3. A method according to claim 2, wherein the generating an image data set includes performing a Fourier transformation on the adjusted data set, and in the adjusting the acquired data set the complex constant is added to a single data point in the acquired data set, prior to the Fourier transformation.

4. A method according to claim 2, wherein the adjusting the acquired data set includes performing a Fourier transformation on the acquired data set, and the complex constant is added to all data points in the acquired data set, subsequent to the Fourier transformation.

5. A method according to claim 3, wherein the adjusting the acquired data set comprises applying a phase shift to the acquired data set.

6. A method according to claim 4, wherein the adjusting the acquired data set comprises applying a phase shift to the acquired data set.

7. A method according to claim 1, further comprising encoding velocity information relating to the object into the phase information.

8. A method according to claim 7, wherein the adjusting the acquired data set is such that a region of zero velocity in the object is represented by image data of non-zero magnitude.

9. An apparatus for Magnetic Resonance Imaging an object, comprising:

a magnetic resonance exciting assembly constructed and arranged to excite magnetic resonance in the object;

a magnetic resonance response detector constructed and arranged to detect signals in the form of an acquired complex data set containing magnitude and phase information;

an adder adapted to add a complex constant to the acquired data set to generate an adjusted complex data set also containing magnitude and phase information; and an image data processor constructed and arranged to generate an image data set from the adjusted data set.

10. An apparatus according to claim 9, wherein the image data processor includes a Fourier transformer constructed and arranged to perform a Fourier transformation on the adjusted data set, and the adder is adapted to add the complex constant to a single data point in the data set prior to the Fourier transformation.

11. An apparatus according to claim 9, wherein the adder includes a Fourier transformer constructed and arranged to perform a Fourier transformation on the acquired data set and is adapted to add the constant to all data points in the acquired data set subsequent to the Fourier transformation.

12. An apparatus according to claim 10 wherein the adder comprises a phase shifter constructed and arranged to phase shift the acquired data set.

13. An apparatus according to claim 11, wherein the adder comprises a phase shifter constructed and arranged to phase shift the acquired data set.

14. An apparatus according to claim 9 further comprising a velocity information encoder constructed and arranged to encode velocity information relating to the object into the phase information.

15. An apparatus according to claim 14, wherein the adder is arranged to represent a region of zero velocity in the object by image data of non-zero magnitude.

16. A method of Magnetic Resonance Imaging an object, comprising:

exciting magnetic resonance in the object;

acquiring magnetic resonance response signals in the form of an acquired complex data set containing magnitude and phase information;

adjusting the acquired data set, in complex form, by one of setting half of the points in the acquired data set to zero and reversing the phase of half of the points in the acquired data set to generate an adjusted complex data set also containing magnitude and phase information;

Fourier transforming the adjusted data set; and generating an image data set in dependence on values derived from the Fourier transformed adjusted data set;

wherein the adjusting the acquired data set is such as to enhance contrast between two regions of interest in the image data set in dependence on the relative phases for the two regions.

17. An apparatus for Magnetic Resonance Imaging an object, comprising:

a magnetic resonance exciting assembly constructed and arranged to excite magnetic resonance in the object;

a magnetic resonance response detector constructed and arranged to detect signals in the form of an acquired complex data set containing magnitude and phase information;

a data adjuster adapted to adjust at least one of half of the points in the acquired data set to zero and reverse the phase of half of the points in the acquired data set to generate an adjusted complex data set also containing magnitude and phase information;

a Fourier transformer constructed and arranged to Fourier transform the adjusted data set; and an image data processor constructed and arranged to generate an image data set from the Fourier transformed adjusted data set.

* * * * *